US007429700B2

(12) United States Patent
Kanamaru et al.

(10) Patent No.: US 7,429,700 B2
(45) Date of Patent: Sep. 30, 2008

(54) LOCK STRUCTURE FOR BOX

(75) Inventors: Masahiro Kanamaru, Kakegawa (JP); Makoto Nakayama, Kakegawa (JP); Taro Inoue, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/611,519

(22) Filed: Dec. 15, 2006

(65) Prior Publication Data

US 2007/0149030 A1 Jun. 28, 2007

(30) Foreign Application Priority Data

Dec. 16, 2005 (JP) .......................... P.2005-363189

(51) Int. Cl.
*H05K 5/00* (2006.01)

(52) U.S. Cl. ........................... 174/50; 174/58; 174/135; 439/535; 248/906

(58) Field of Classification Search ................... 174/50, 174/17 R, 57, 58, 135; 220/4.02, 3.8; 439/535, 439/352; 248/906; 361/600, 683; 312/223.1, 312/223.2
See application file for complete search history.

(56) References Cited

U.S. PATENT DOCUMENTS 2,538,661 A * 1/1951 Vischer, Jr. ................. 220/240
3,391,967 A * 7/1968 Schreyer .................. 312/317.1
5,378,174 A * 1/1995 Brownlie et al. ............ 439/709
6,113,414 A * 9/2000 Fukuda ....................... 439/352
7,214,875 B1 * 5/2007 Gretz .......................... 174/53
7,253,359 B2 * 8/2007 Chen et al. .................... 174/50

FOREIGN PATENT DOCUMENTS

JP 05-147665 A 6/1993

* cited by examiner

*Primary Examiner*—Dhiru R Patel
(74) *Attorney, Agent, or Firm*—Sughrue Mion, PLLC

(57) ABSTRACT

A lock structure for a box includes a first box member having a retaining projection, and a second box member having an elastic retaining arm. The retaining arm has at its distal end a retaining portion for engagement with the retaining projection. The first box member has an arm restraint rib which restricts a releasing movement of the retaining arm in a condition in which the retaining arm and the retaining projection are engaged with each other. When the arm restraint rib is pressed by the elastic retaining arm, the arm restraint rib is deformed by a pressing force of the elastic retaining arm. A retaining distance of the retaining projection relative to the retaining portion of the elastic retaining arm is larger than a gap between the elastic retaining arm and the arm restraint rib in the engaged condition.

3 Claims, 11 Drawing Sheets

LOCK STRUCTURE FOR BOX

BACKGROUND OF THE INVENTION

This invention relates to a lock structure for a box which is applied to a box such as an electric connection box mounted on a vehicle or an exterior box for receiving it.

As a box lock structure of this type, various structures have heretofore been proposed. A first related technique is shown in FIGS. 7 and 8.

In FIGS. 7 and 8, a retaining projection 101 is formed on an inner side surface of an upper cover 100. An elastic retaining arm 103 is formed in an upstanding manner at a side wall of a lower cover 102, and a distal end retaining portion 103*a* is formed in a projecting manner at a distal end of this elastic retaining arm 103.

In the above construction, when the upper cover 100 and the lower cover 102 are assembled together, the elastic retaining arm 103 is moved in a locking direction. With this movement, first, the distal end retaining portion 103*a* of the elastic retaining arm 103 is brought into abutting engagement with the retaining projection 101, and the elastic retaining arm 103 is elastically bent and deformed, so that the distal end retaining portion 103*a* passes over the retaining projection 101. When the distal end retaining portion 103*a* moves to a position where it completely passes over the retaining projection 101, the elastic retaining arm 103 is bent and restoringly deformed, so that the distal end retaining portion 103*a* is retained by the retaining projection 101. With the foregoing, a locked condition is established between the upper cover 100 and the lower cover 102.

In the lock structure of this first related technique, when a high lock canceling force acts on the elastic retaining arm 103 in the locked position to elastically bend and deform the elastic retaining arm 103, the lock is canceled. Therefore, the lock retaining force depends only on the elastic restoring force of the elastic retaining arm 103.

Also, in order to form the first related technique into a structure in which the lock is made even a little harder to be canceled, a lock structure of a second related technique shown in FIGS. 9 to 11 has been proposed.

As shown in FIGS. 9 to 11, in the lock structure of this second related technique, an arm restraint rib 104 is formed on an inner surface of an upper wall of an upper cover 100. This arm restraint rib 104 is disposed at a rear side of an elastic retaining arm 103 which is to be retained by a retaining projection 101. When a height of the retaining projection 101 is represented by d, and a gap between the arm restraint rib 104 and the elastic retaining arm 103 located in a locked position is represented by D, the position of the arm restraint rib 104 is set such that d<D is established. Therefore, in the process of movement of the elastic retaining arm 103 in a locking direction, a distal end retaining portion 103*a* of the elastic retaining arm 103 can pass over the retaining projection 101 without interference by the arm restraint rib 104 as shown in FIG. 10.

In the lock structure of this second related technique, the elastic retaining arm 103 located in the locked position can not be shifted in a large amount in an elastically-bending direction as shown in FIG. 11, and therefore in this structure, the lock is harder to be canceled as compared with the first related technique. Further, the following publication exists as the prior art.

[Patent Literature 1] JP-A-5-147665

However, even in the lock structure of the second related technique, the lock retaining force basically depends only on the elastic restoring force of the elastic retaining arm 103, and therefore this structure has not sufficiently met the requirement that the lock should be made hard to be canceled.

Here, if the position of the arm restraint rib 104 is set such that d>D is established, the lock retaining force can be enhanced, but in this structure, in the process of movement of the elastic retaining arm 103 in the locking direction, the distal end retaining portion 103*a* of the elastic retaining arm 103 interferes with the arm restraint rib 104, and can not pass over the retaining projection 101.

SUMMARY OF THE INVENTION

Therefore, this invention has been made in order to overcome the above problems, and an object of the invention is to provide a lock structure for a box in which an elastic retaining arm can be moved in a locking direction, and besides is hard to be unlocked in a locked position.

A lock structure for a box, comprising:

a first box member which has a retaining projection; and a second box member which has an elastic retaining arm, wherein the retaining arm has at its distal end a retaining portion for engagement with the retaining projection;

wherein the first box member has an arm restraint rib which restricts a releasing movement of the retaining arm in a condition in which the retaining arm and the retaining projection are engaged with each other;

wherein when the arm restraint rib is pressed by the elastic retaining arm, the arm restraint rib is deformed by a pressing force of the elastic retaining arm; and wherein a retaining distance of the retaining projection relative to the retaining portion of the elastic retaining arm is larger than a gap between the elastic retaining arm and the arm restraint rib in the engaged condition.

Preferably, the retaining portion is formed on a first surface of the retaining arm. The arm restraint rib is disposed so as to be opposed to a second surface of the retaining arm which is opposite to the first surface.

Preferably, the arm restraint rib has a pair of arm restraint rib pieces. The pair of arm restraint rib pieces are formed so as to surround the second surface of the retaining arm. A gap between the pair of arm restraint rib pieces is disposed at a position corresponding to a central position of the second surface of the retaining arm.

In the present invention, the elastic retaining arm is moved in a locking direction, and when the distal end retaining portion of the elastic retaining arm is brought into abutting engagement with the retaining projection, the elastic retaining arm is elastically bent and deformed, and at this time the retaining portion interferes with the arm restraint rib. However, the arm restraint rib, while receiving the pressing force of the elastic retaining arm, is also elastically bent and deformed, and therefore the retaining portion can pass over the retaining projection. Then, when the retaining portion moves to a position where it completely passes over the retaining projection, the elastic retaining arm is bent and restoringly deformed, so that the distal end retaining portion of the elastic retaining arm is retained by the retaining projection (The engaged condition). When an external force in a lock canceling direction acts on the elastic retaining arm disposed in the locked position, so that the elastic retaining arm is slightly elastically bent and deformed, the elastic retaining arm interferes with the arm restraint rib. Therefore, unless an external force large enough to even elastically bend and deform the arm restraint rib acts, the lock will not be canceled. With the foregoing, the elastic lock arm can be moved in the locking direction, and besides is hard to be unlocked in the locked position.

BRIEF DESCRIPTION OF THE DRAWINGS

The object and advantages of the present invention will become manifest from the description in the Detailed Description of the Preferred embodiment upon making reference to the accompanying drawings.

FIG. 3A is a perspective view of an arm restraint rib, and FIG. 3B is a perspective view of the arm restraint rib and an elastic retaining arm;

DETAILED DESCRIPTION OF THE PREFERRED EMBODIMENT

One embodiment of the present invention will hereafter be described with reference to the drawings.

Figure 1:
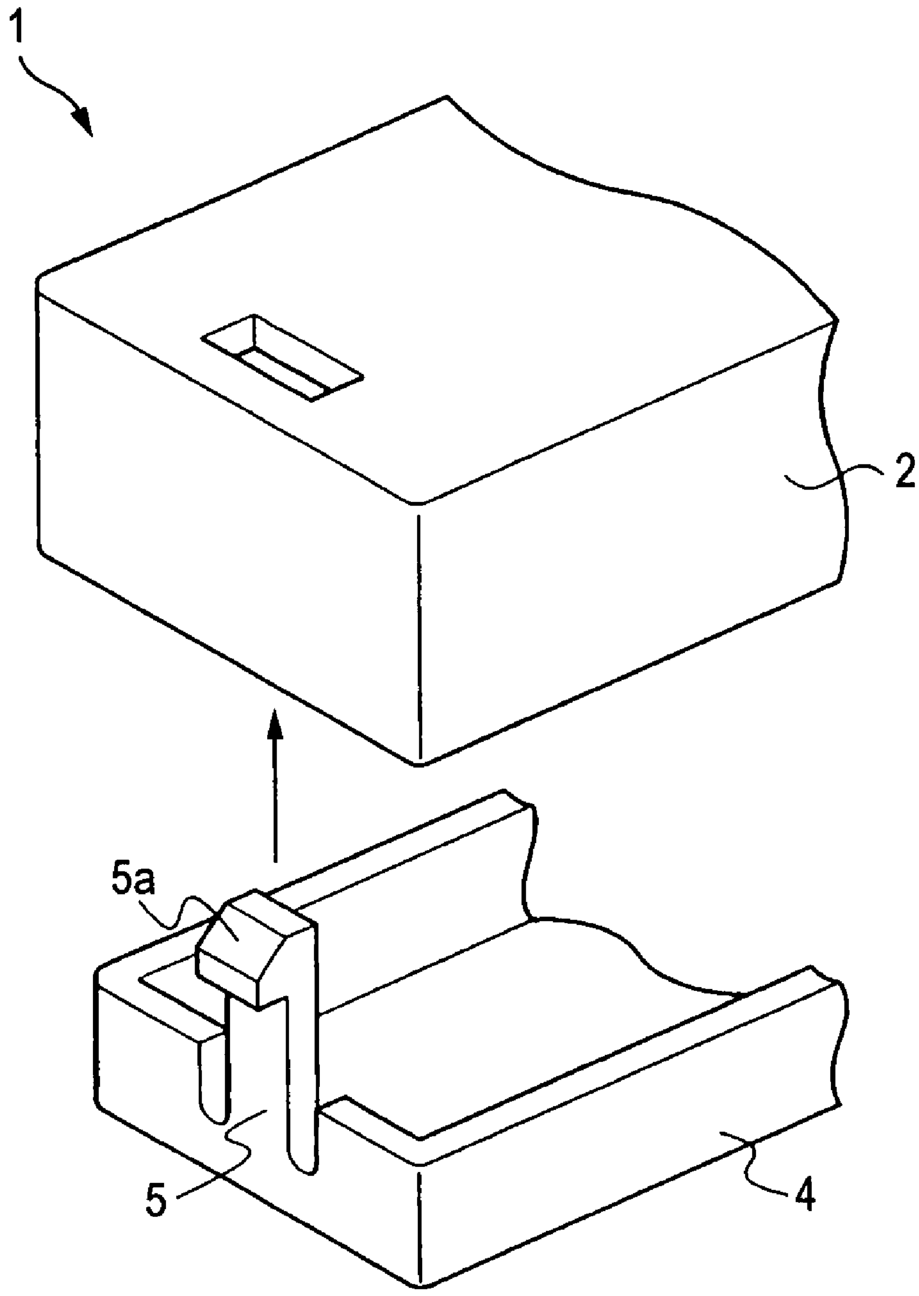
FIG. 1 shows one embodiment of the present invention, and is an exploded perspective view of an important portion of an electric connection box.
Figure 2:
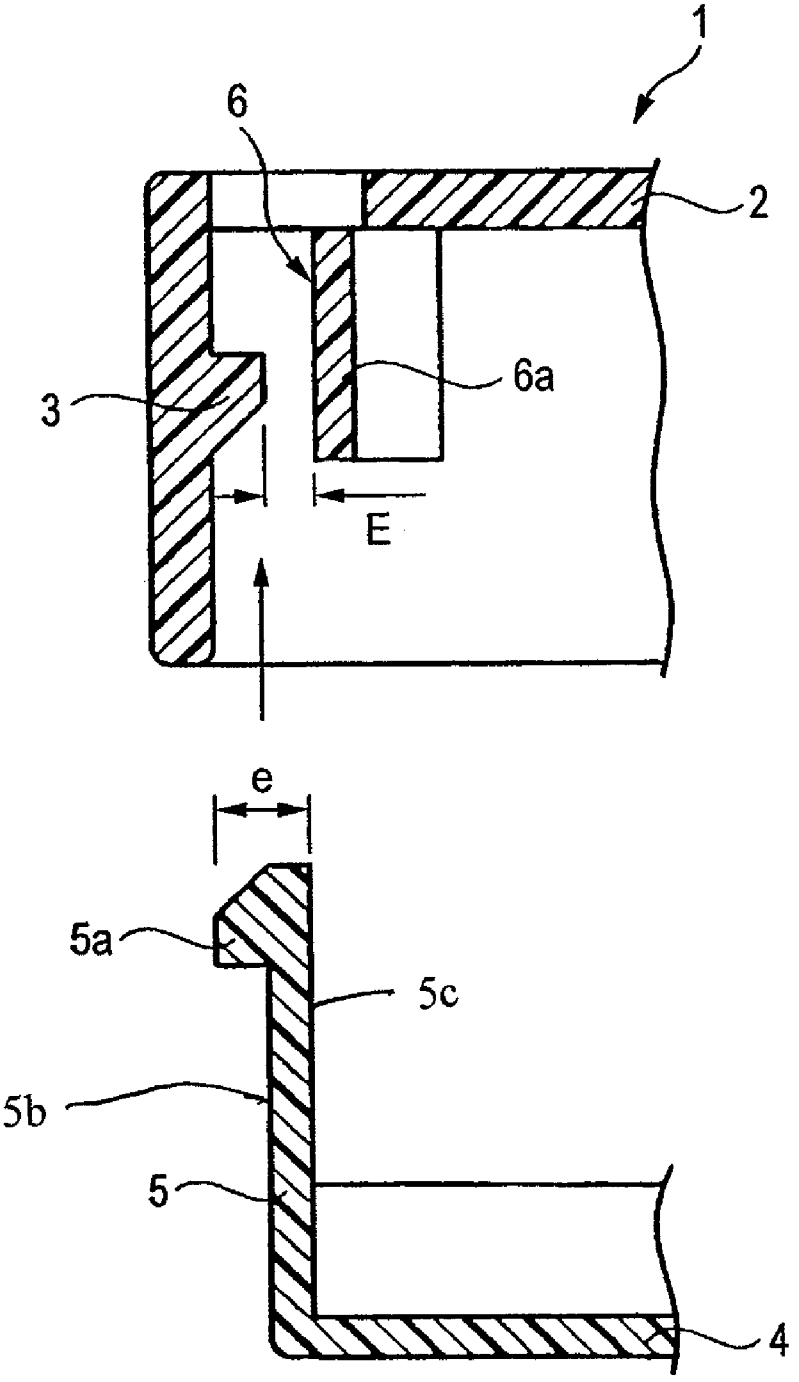
FIG. 2 shows the one preferred embodiment of the present invention, and is a cross-sectional view of a lock structure for the electric connection box before it is locked.
Figure 3A:
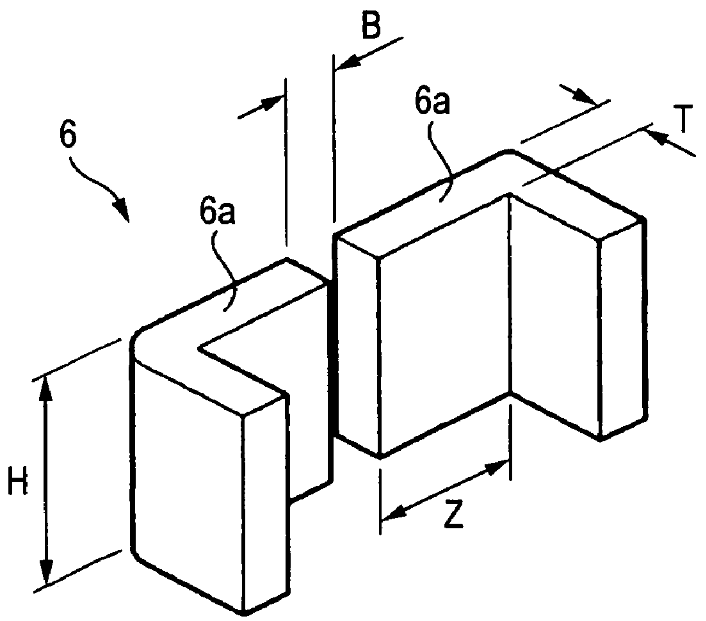
FIGS. 3A and 3B show the one preferred embodiment of the present invention.
Figure 3B:
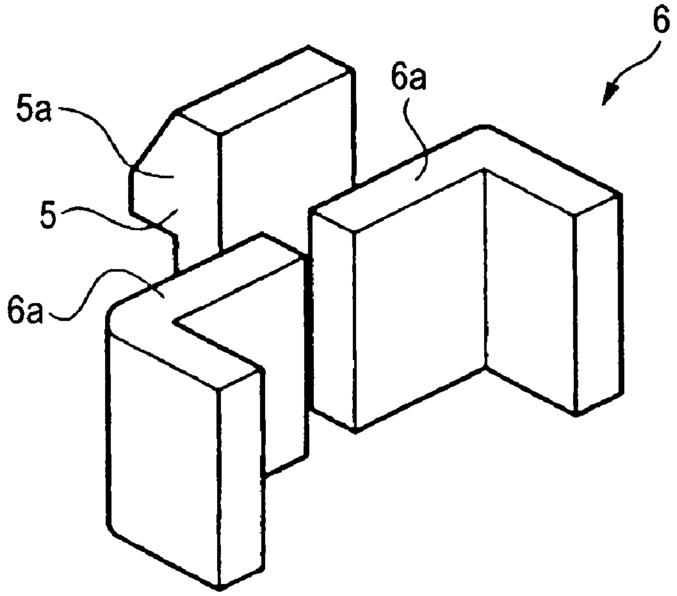
Figure 4:
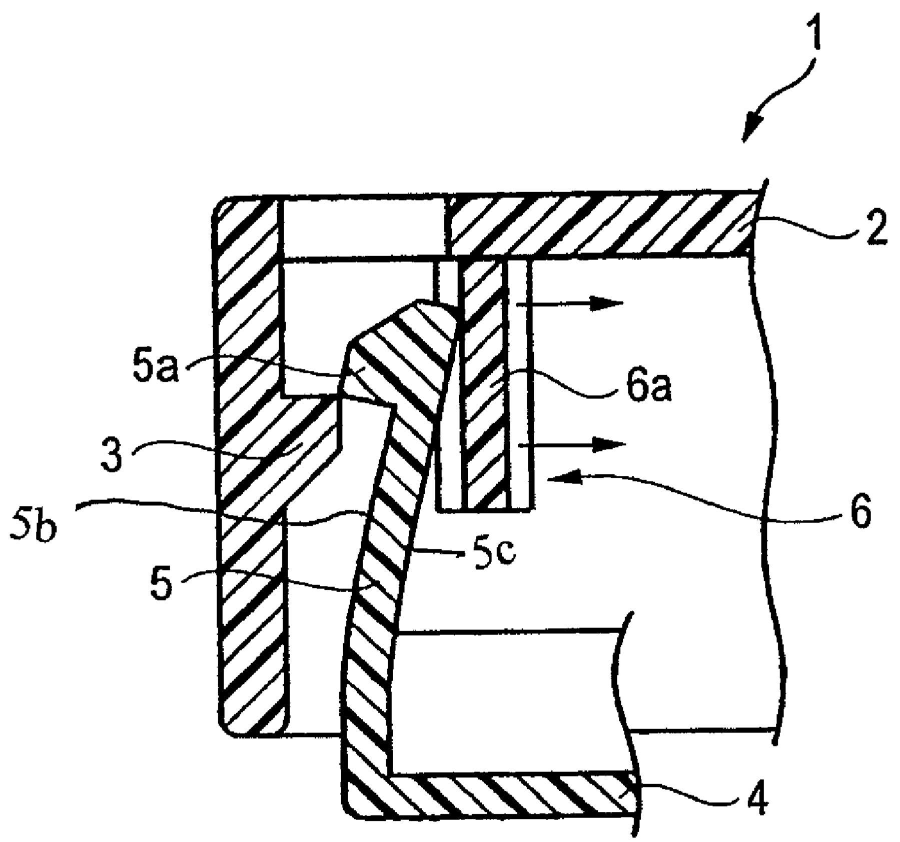
FIG. 4 shows the one embodiment of the present invention, and is a cross-sectional view of the lock structure for the electric connection box in a lock-proceeding position.
Figure 5:
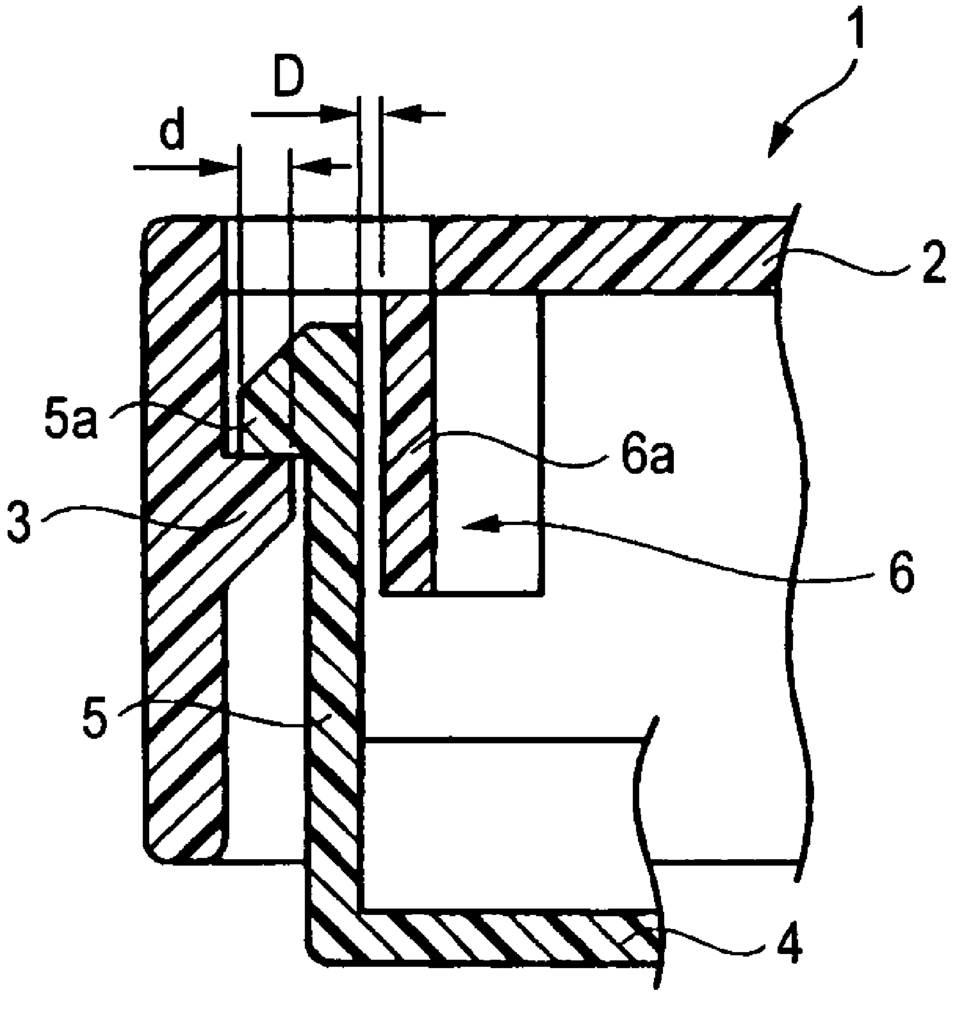
FIG. 5 shows the one embodiment of the present invention, and is a cross-sectional view of the lock structure for the electric connection box in a locked position.
Figure 6:
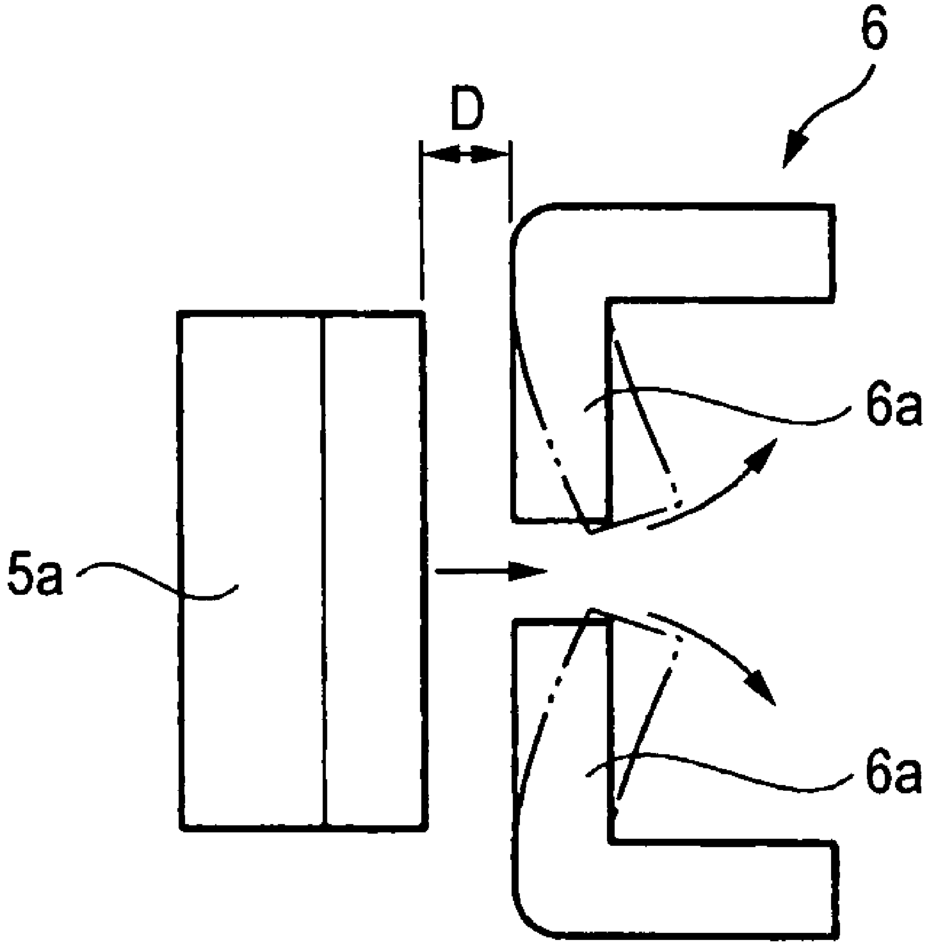
FIG. 6 shows the one embodiment of the present invention, and is a plan view explanatory of the behavior of the arm restraint rib obtained when the elastic retaining arm in the locked position is elastically bent and deformed.
Figure 7:
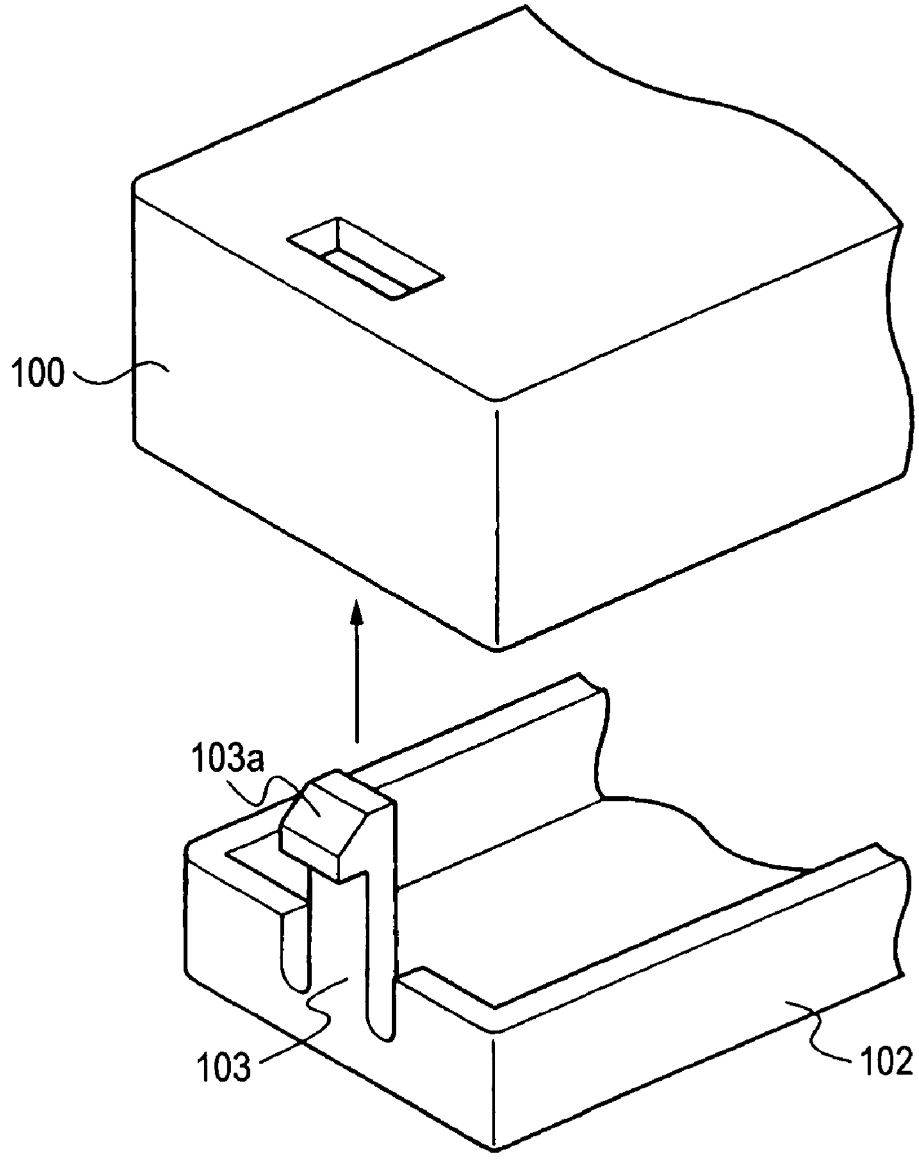
FIG. 7 shows a first related technique, and is an exploded perspective view of an important portion of an electric connection box.
Figure 8:
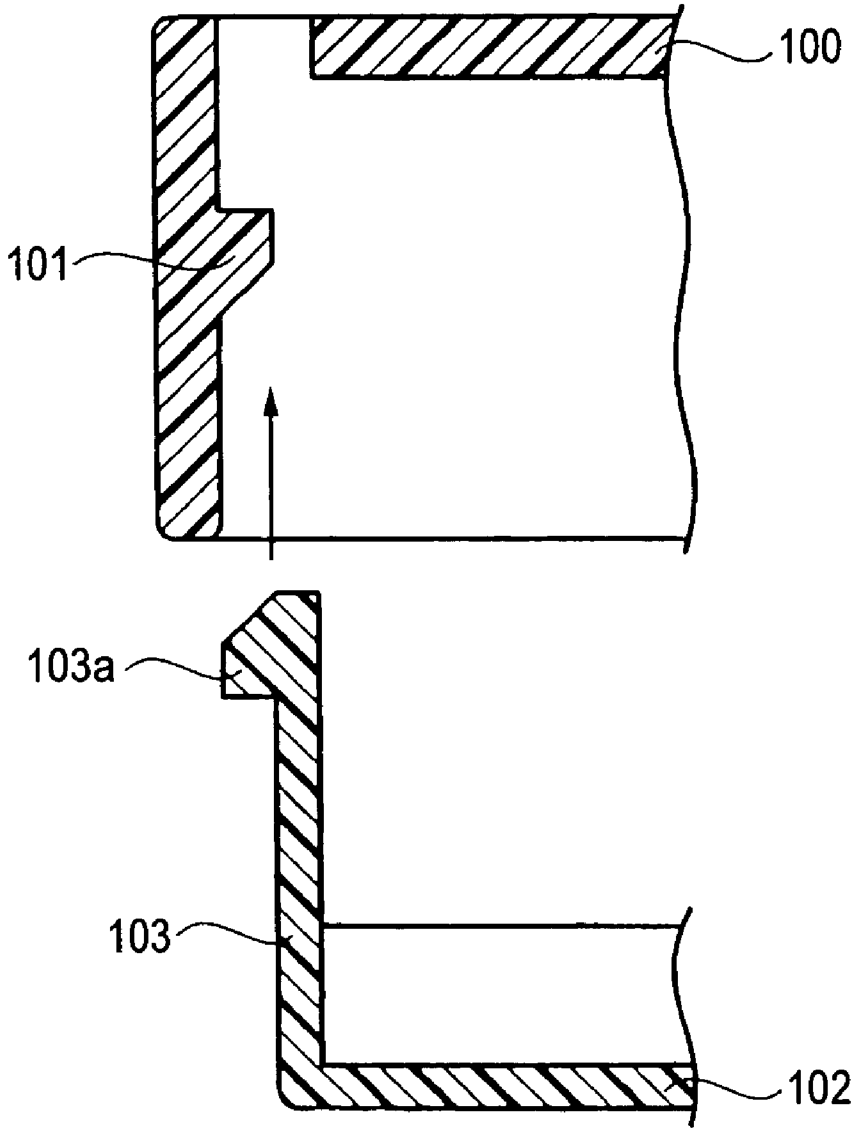
FIG. 8 shows the first related technique, and is a cross-sectional view of a lock structure for the electric connection box before it is locked.
Figure 9:
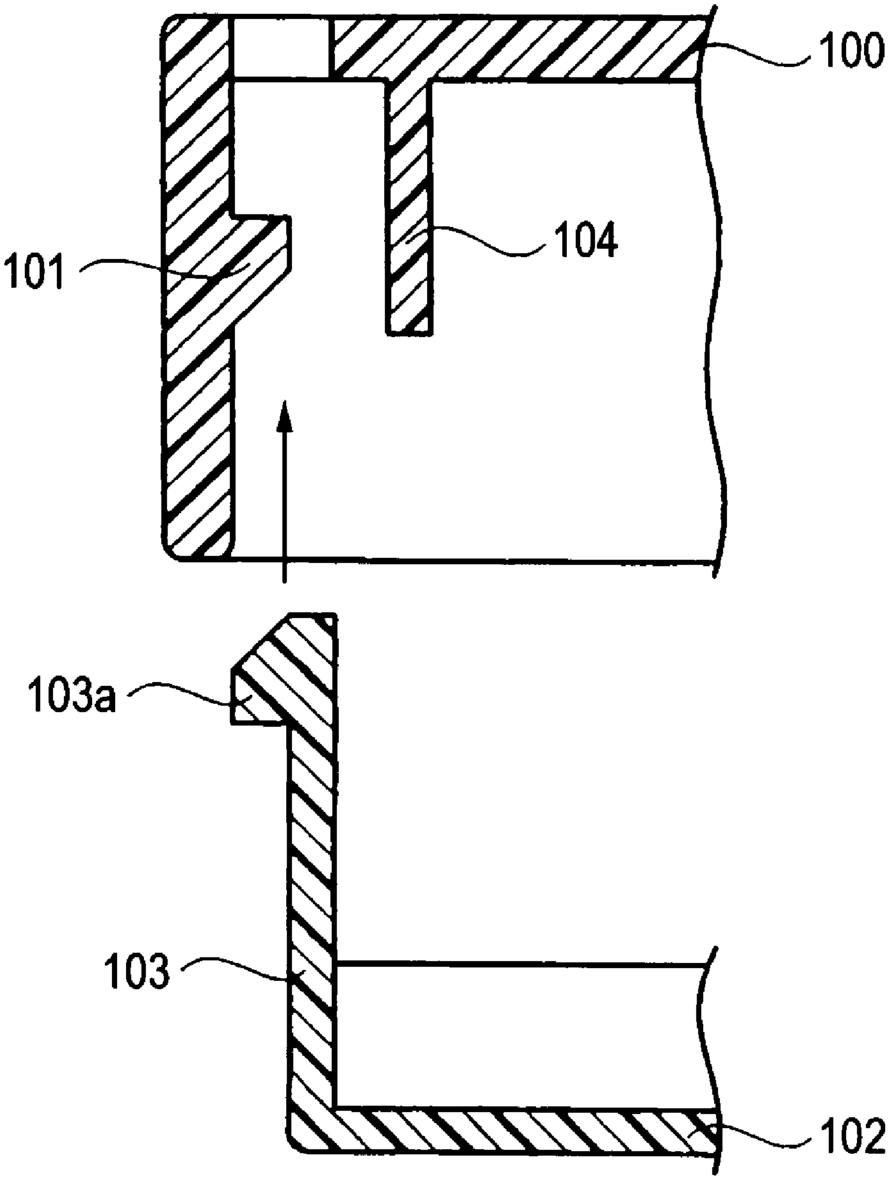
FIG. 9 shows a second related technique, and is a cross-sectional view of a lock structure before it is locked.
Figure 10:
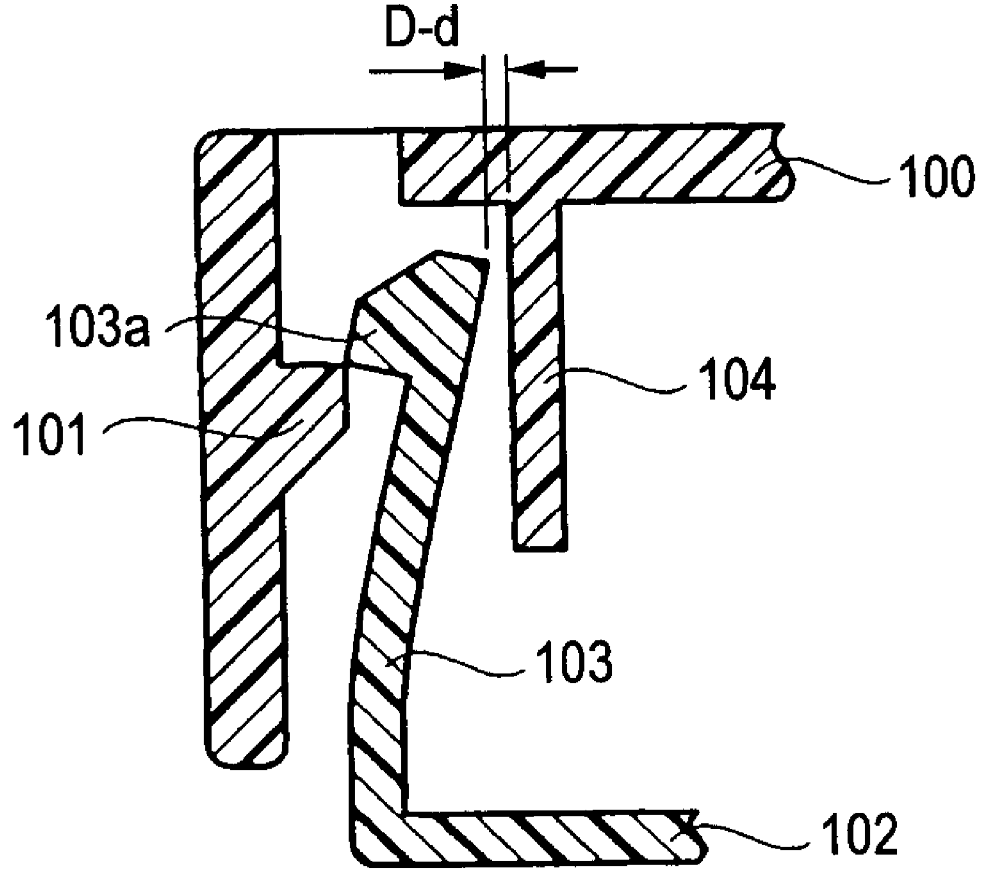
FIG. 10 shows the second related technique, and is a cross-sectional view of the lock structure in a lock-proceeding position.
Figure 11:
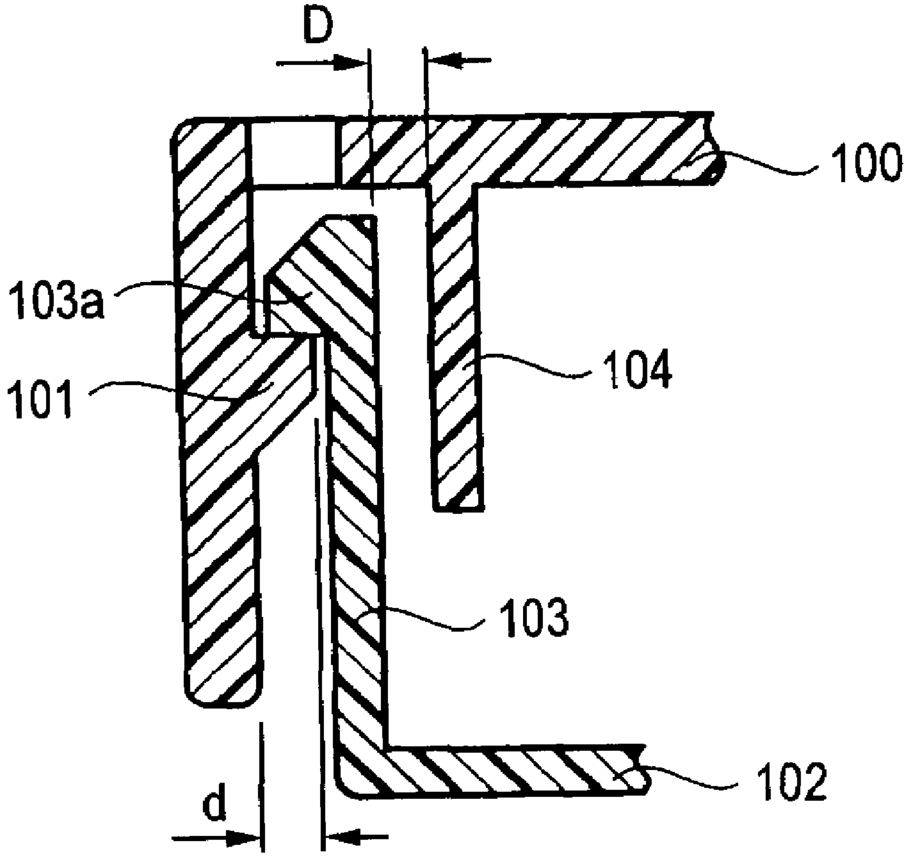
FIG. 11 shows the second related technique, and is a cross-sectional view of the lock structure in a locked position.

FIGS. 1 to 6 show the one embodiment in which a lock structure of the present invention is applied to an electric connection box, and FIG. 1 is an exploded perspective view of an important portion of the electric connection box, FIG. 2 is a cross-sectional view of the lock structure for the electric connection box before it is locked, FIG. 3A is a perspective view of an arm restraint rib, FIG. 3B is a perspective view of the arm restraint rib and an elastic retaining arm, FIG. 4 is a cross-sectional view of the lock structure for the electric connection box in a lock-proceeding position, FIG. 5 is a cross-sectional view of the lock structure for the electric connection box in a locked position, and FIG. 6 is a plan view explanatory of the behavior of the arm restraint rib obtained when the elastic retaining arm in the locked position is elastically bent and deformed.

As shown in FIGS. 1 and 2, the electric connection box 1 which is a box includes a synthetic resin-made upper cover 2 (first box member), and a synthetic resin-made lower cover 4 (second box member)to be attached thereto. A retaining projection 3 is formed on an inner side surface of the upper cover 2. The elastic retaining arm 5 is formed in an upstanding manner at a side wall of the lower cover 4, and a distal end retaining portion 5a is formed at a distal end of this elastic retaining arm 5 on a first surface 5*b* thereof Further, the arm restraint rib 6 is formed on an inner surface of an upper wall of the upper cover 2. This arm restraint rib 6 is disposed so as to be opposed to a second surface 5*c*of the retaining arm opposite the first surface 5*b*. When a retaining distance (retaining length) of the retaining projection 3 relative to the distal end retaining portion 5*a* of the elastic retaining arm 5 is represented by d, and a gap between the arm restraint rib and the elastic retaining arm 5 located in the locked position is represented by D as shown in FIG. 5, the position of the arm restraint rib is set such that the condition, d>D, is satisfied.

As shown in FIGS. 3A and 3B, the arm restraint rib 6 is divided in two by a gap at a central position of its frame-like shape surrounding the rear side of the elastic retaining arm 5, and is formed by a pair of left and right arm restraint rib pieces 6*a*, 6*a* formed by this two-division arrangement. When the pair of arm restraint rib pieces 6*a*, 6*a* are pressed by elastic bending deformation of the elastic retaining arm 5, these pieces are elastically bent and deformed by this pressing force. Therefore, a force of moving of the elastic retaining arm 5 in a locking direction can be adjusted by an elastic bending force of the elastic retaining arm 5 itself and an elastic bending force of the pair of arm restraint rib pieces 6*a*, 6*a*. Here, the elastic bending force of the pair of arm restraint rib pieces 6*a*, 6*a* can be adjusted by a width B of the gap, a plate thickness T, a length Z and a height H.

Next, an operation for assembling the electric connection box 1 will be described.

In the condition of FIG. 2, when the upper cover 2 and the lower cover 4 are assembled together, the elastic retaining arm 5 is moved in the locking direction. In this moving process, first, when the distal end retaining portion 5*a* of the elastic retaining arm 5 is brought into abutting engagement with the retaining projection 3, the elastic retaining arm 5 is elastically bent and deformed, and the rear surface of the distal end retaining portion 5*a* of the elastically-bent and displaced elastic retaining arm 5 interferes with the pair of arm restraint rib pieces 6*a*, 6*a*. As a result, the pair of arm restraint rib pieces 6*a*, 6*a*, while receiving a pressing force of the distal end retaining portion 5*a*, are also elastically bent and deformed in a direction of an arrow of FIG. 4 as shown in FIG. 4, so that the distal end retaining portion 5*a* can pass over the retaining projection 3. When the distal end retaining portion 5*a* of the elastic retaining arm 5 is moved to a position where this distal end retaining portion 5*a* completely passes over the retaining projection 3, the elastic retaining arm 5 is bent and restoringly deformed as shown in FIG. 5, so that the distal end retaining portion 5*a* is retained by the retaining projection 3. With the foregoing, the locked condition is established between the upper cover 2 and the lower cover 4.

In the locked condition, when an external force in a lock canceling direction acts on the elastic retaining arm 5, the elastic retaining arm 5 tends to be elastically bent and deformed. When the elastic retaining arm 5 is elastically bent and displaced by a small distance in a direction of an arrow of FIG. 6, the rear surface of the elastic retaining arm 5 is brought into abutting engagement with the pair of arm restraint rib pieces 6*a*, 6*a*. As a result, the pair of arm restraint rib pieces 6*a*, 6*a* are also elastically bent and deformed in directions of arrows of FIG. 6, and elastic restoring forces of the pair of arm restraint rib pieces 6*a*, 6*a* act on the elastic retaining arm 5. As a result, the elastic bending deformation of the elastic retaining arm 5 is suppressed. Namely, unless an external force large enough to even elastically bend and deform the pair of arm restraint rib pieces 6*a*, 6*a* in a large amount acts, the lock will not be canceled. With the foregoing, the elastic lock arm 5 can be moved in the locking direction, and besides is hard to be unlocked in the locked position.

In this embodiment, the arm restraint rib 6 is divided in two by the gap at the central position of its frame-like shape surrounding the rear side of the elastic retaining arm 5, and is formed by the pair of left and right arm restraint rib pieces 6*a*, 6*a* formed by this two-division arrangement. However, the arm restraint rib is not limited to such a structure, and may be of any structure in so far as it, when pressed by the elastic retaining arm 5, can be elastically bent and deformed by this pressing force.

In the above embodiment, the arm restraint rib 6 is disposed at the rear side of the elastic retaining arm 5 which is to be retained by the retaining projection 3, and it is defined that when the retaining distance of the retaining projection 3 relative to the distal end retaining portion 5*a* of the elastic retaining arm 5 is represented by d, and the gap between the arm restraint rib and the elastic retaining arm 5 located in the locked position is represented by D, the position of the arm restraint rib is set such that the condition, d>D, is satisfied. However, it may also be considered that when the thickness of the distal end retaining portion 5*a* in the elastically-shifting direction is represented by e, and the gap between the arm restraint rib 6 and the retaining projection 3 is represented by E, the position of the arm restraint rib is set such that the condition, e>E, is satisfied.

Incidentally, in the above embodiment, although the retaining projection 3 is formed at the upper cover 2, while the elastic retaining arm 5 is formed at the lower cover 4, the elastic retaining arm 5 may, of course, be formed at the upper cover 2, while the retaining projection 3 may be formed at the lower cover 4. Furthermore, although the box is shown as the electric connection box 1, it may be an exterior box for covering the electric connection box 1 from the outer side thereof or a box other than it.

Although the present invention has been described in detail with reference to the specific embodiment, it will be manifest to those skilled in the art that various changes and modifications can be added without departing from the spirits and scope of the invention and the intended scope.

The present invention is based on a Japanese Patent Application (Patent Application No. 2005-363189) filed on Dec. 16, 2005, and its contents are incorporated herein as a reference.

The invention claimed is:

1. A lock structure for a box, comprising;

a first box member which has a retaining projection; and a second box member which has an elastic retaining arm, wherein the retaining arm has at its distal end a retaining portion for engagement with the retaining projection;

wherein the first box member has an arm restraint rib which restricts a releasing movement of the retaining arm in a condition in which the retaining arm and the retaining projection are engaged with each other;

wherein when the restraint rib is presented by the elastic retaining arm, the restraint rib is deformed by a pressing force of the elastic retaining arm; and wherein a retaining distance of the retaining projection relative to the retaining portion of the elastic retaining arm is larger than a gap between the elastic retaining arm and the arm restraint rib in the engaged condition.

2. The lock structure according to claim 1, wherein the retaining portion is formed on a first surface of the retaining arm; and wherein the arm restraint rib is disposed so as to be opposed to a second surface of the retaining arm which is opposite to the first surface.

3. The lock structure according to claim 1, wherein the arm restraint rib has a pair of arm restraint rib pieces;

wherein the pair of arm restraint rib pieces are formed so as to surround the second surface of the retaining arm; and wherein a gap between the pair of arm restraint rib pieces is disposed at a position corresponding to a central position of the second surface of the retaining arm.

* * * * *